(12) United States Patent
Tomassen et al.

(10) Patent No.: US 7,211,215 B1
(45) Date of Patent: May 1, 2007

(54) MOULD, ENCAPSULATING DEVICE AND METHOD OF ENCAPSULATION

(75) Inventors: Marcel Gerardus Antonius Tomassen, Zevenaar (NL); Antonius Bernardus Claassen, Herwen (NL)

(73) Assignee: Fico B.V. (NL)

( * ) Notice: Subject to any disclaimer, the term of this patent is extended or adjusted under 35 U.S.C. 154(b) by 0 days.

(21) Appl. No.: 09/743,155

(22) PCT Filed: Jul. 5, 1999

(86) PCT No.: PCT/NL99/00424

§ 371 (c)(1),
(2), (4) Date: Mar. 22, 2001

(87) PCT Pub. No.: WO00/02242

PCT Pub. Date: Jan. 13, 2000

(30) Foreign Application Priority Data

Jul. 6, 1998 (NL) .................................... 1009563

(51) Int. Cl.
*B29C 45/03* (2006.01)
*B29C 45/04* (2006.01)
*B29C 45/14* (2006.01)

(52) U.S. Cl. ................. 264/511; 264/272.15; 264/275; 425/129.1; 425/546; 425/572; 425/573; 425/589

(58) Field of Classification Search ................ 264/101, 264/102, 510, 511, 513, 272.11, 271.1, 272.15, 264/272.17, 272.14, 328.4, 328.5, 328.8; 425/116, 120, 129.1, 544, 546, 572, 573
See application file for complete search history.

(56) References Cited

U.S. PATENT DOCUMENTS

| 4,126,292 | A | * | 11/1978 | Saeki et al. ................. 249/110 |
| 4,388,265 | A | * | 6/1983 | Bandoh .................... 264/297.2 |
| 4,599,062 | A | * | 7/1986 | Konishi ...................... 425/116 |
| 4,861,251 | A | * | 8/1989 | Moitzger .................... 425/116 |
| 5,252,280 | A | * | 10/1993 | Motisi ........................ 264/161 |
| 6,531,083 | B1 | * | 3/2003 | Bolanos et al. ........ 264/272.13 |

FOREIGN PATENT DOCUMENTS

| EP | 0730937 | 9/1996 |
| JP | 55003613 | 1/1980 |
| JP | 63162206 | 4/1988 |
| JP | 04267348 | 2/1991 |
| JP | 06021120 | 1/1994 |
| JP | 08051168 | 2/1996 |

* cited by examiner

*Primary Examiner*—Edmund H. Lee
(74) *Attorney, Agent, or Firm*—The Webb Law Firm

(57) ABSTRACT

The invention relates to a mould for encapsulating electronic components mounted on a carrier, comprising: at least two mould parts displaceable relative to each other, at least one of which is provided with a recess, and feed means for encapsulating material, wherein at least one of the mould parts is provided with a runner which connects on one side to a wall of a mould part co-defining a mould cavity and connects on the other side to a side of the mould part remote from the mould cavity. The invention also relates to an encapsulating device of which such a mould forms parts, and to a method for encapsulating electronic components mounted on a carrier.

8 Claims, 1 Drawing Sheet

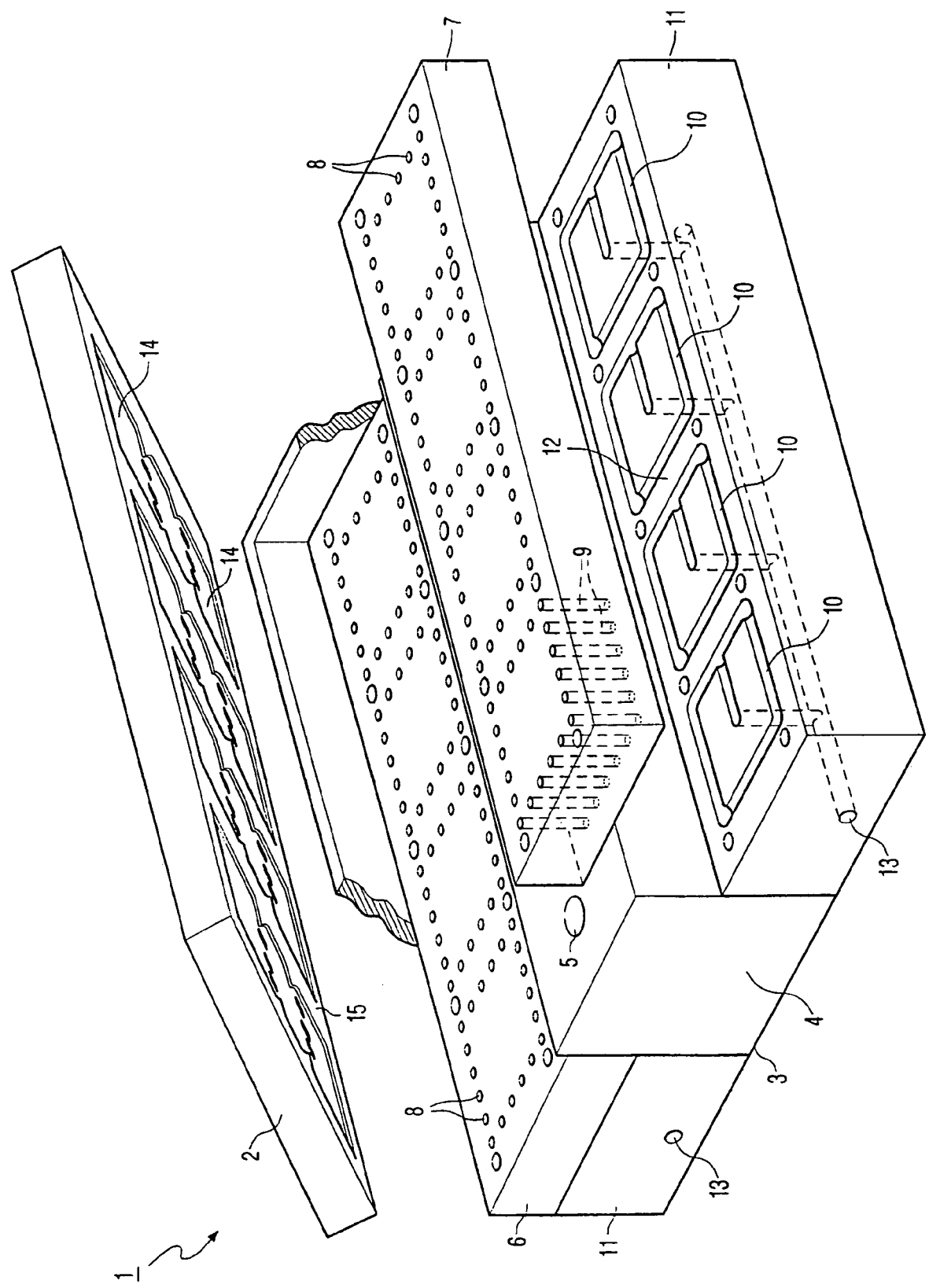

MOULD, ENCAPSULATING DEVICE AND METHOD OF ENCAPSULATION

BACKGROUND OF THE INVENTION

The invention relates to a mould for encapsulating electronic components mounted on a carrier. The invention also relates to an encapsulating device. Finally, the invention also relates to a method for encapsulating components mounted on a carrier.

Such a mould, encapsulating device and method form known art with which, using for instance epoxy resin, a package of encapsulating material can be applied round an electronic component arranged on a carrier. This technique is used particularly for encapsulating semiconductor products, such as for instance chips.

1. Description of the Prior Art

The European patent application EP 0 730 937 discloses a resin moulding machine with release film. The machine is provided with a mechanism that fixes release film on inner faces of the moulding sections and clamping faces. Also disclosed are air sucking holes in the upper die to hold substrates in the upper die. The loading of substrates in the machine with air sucking holes in the upper die takes a lot of time. The apparatus is also not suited for lead frames with wire bounded electronic components.

There is a tendency in the market towards arranging packages of encapsulating material on a carrier which are increasingly larger in terms of surface area. During further processing these can be for instance sawn into separate parts. This technique is also known as "C.S.P.", which is derived from "chip size packaging". The existing moulds and methods have the drawback that when the mould parts are closed a part of the electronic components can come into contact with a mould part. This can for instance cause damage to the components and/or contact wires ("leads") can be deformed. This is the particular consequence of a carrier not being completely flat when it is placed in a mould. Particularly carriers on which larger packages of encapsulating material must be arranged so that a plurality of electronic components can be moulded simultaneously with one package have such a three-dimensional form. The reason for this is that these carriers are in general thermally treated at many points during placing of the electronic components. This results in stresses in the carrier which, when it is placed in a mould, can result in the carrier not being completely flat. As described above, this results in possible damage to the electronic components and/or connecting wires.

The present invention has for its object to provide an improved mould, encapsulating device and method for encapsulating electronic components mounted on a carrier, with which damage to electronic components and contact wires can be prevented.

SUMMARY OF THE INVENTION

The invention provides for this purpose a mould. With such a mould a carrier can be placed on a simple way on the lower mould part and sucked against the lower mould part before closing of the mould. An important advantage over the prior art is that the carrier is easier to place on a bottom wall of the lower mould part than in an upper mould part. As of the number of apertures in the mould the carrier lies more or less flat against the lower mould part. The force of gravity thus co-acts with the suction through the runner, which makes it easier to position the carrier more or less flat. Thus is prevented that, when the mould is closed, electronic components and/or contact wires come into contact with a counter-mould part because the carrier is not flat. Especially where contact of components with the upper mould can occur, on positions opposite the recess in the upper mould, the carrier is due to the location of the apertures to be sucked to the lower mould. Avoiding this contact means that damage to electronic components and/or contact wires is prevented. The number of apertures onto which runners connect makes that the carrier can be placed in flat position on a mould pact with great precision. This increases the reliability of the mould. In a preferred embodiment a plurality of runners connecting onto the wall co-defining the mould cavity are in mutual communication and are connected to a single runner which connects onto a side of the mould part remote from the mould cavity. By extracting gases through a single runner it can thus be achieved that the carrier is adhered by suction at a plurality of positions. A mould with great reliability can thus be realized with a simple suction.

The Japanese patent JP 06 021120 discloses a moulding apparatus for mounting parts carrying semiconductor chips. The bottom of a cavity of a lower metal mould has a sucking hole C to prevent deviation of the mounting part in lateral direction and to improve the yield rate. This apparatus is only suited for processing special products with a tip part that is held between a lower and an upper mould and a mounting part that is located below the tip part. As the apparatus possesses only one sucking hole the apparatus is also not suited for placing a mounting part in a flat position when the mounting part was deformed before processing in the apparatus.

The runner preferably debouches in a wall defining a mould cavity, which wall is screened from the feed opening for encapsulating material by the carrier when encapsulating material is fed to the mould. In order to prevent encapsulating material entering the runner, the runner and feed opening for encapsulating material must be placed relative to each other such that during the encapsulating they are mutually separated by a carrier. It is noted here that it is recommended that the wall defining a mould cavity is formed by the bottom of the lower mould part.

In yet another preferred embodiment the lower mould is also provided with at least one aligning edge for positioning a carrier relative to the mould part. Since it can be difficult to displace a carrier again relative to a mould part once the former has been adhered by suction by the runner, it is recommended to first place the carrier at the correct position and then to activate the suction action by means of the runner. Another option is to activate the suction section of the runner immediately on placing, and in this case it is recommended to place the carrier directly at the correct position in the mould part. The aligning edge is also useful here.

The invention also comprises an encapsulating device. For suction of the carrier by means of the runner it is necessary for an underpressure to be applied in the runner. This is realized by means of the fan which extracts gases. A carrier can thus also remain sucked against a mould part when the mould is opened, whereby the carrier with encapsulating material can be "pulled loose" from an opposite mould part.

This opposite mould part (for instance the top mould) can thus be embodied without ejector pins, which makes the construction of the upper mould more simple. The facility of blowing gases into the runner makes that an overpressure in the runner can be realised. This makes it possible to exert a force on the carrier with such that the carrier is released from the lower mould part. It is thus possible to embody the mould in simplified manner compared to the moulds applied in the prior art. These after all employ ejector pins for pressing a carrier out of the mould after applying of the encapsulating material. It will be apparent that a mould incorporating a number of ejector pins has an emphatically more complex structure than a mould in which these can be omitted or arranged in more limited number. An additional advantage of blowing gases into the runner is that in this manner the runner can be cleaned of possible contaminants. It is thus also recommended to apply at least limited over-pressure in the runner during cleaning of the mould so that no contaminants can be brushed or otherwise carried into the runner.

The invention also relates to a method for encapsulating electronic components. By means of this method the carrier can be placed in close-fitting connection against a wall of a mould part before the mould is closed. This results in the advantages as already described above. Preferably, after step A) during a step B) an under-pressure is applied in the runner (9), whereby the carrier is sucked to lower mould part (3). By means of this method the carrier can be placed in close-fitting connection against a wall of a mould part before the mould is closed. This results in the advantages as already described above. With this method two advantages as described above are combined. That is, the carrier can be arranged close-fittingly in a mould part and, after the encapsulating process, the carrier will be released from the relevant mould part by overpressure in the runner. The advantages of both methods are hereby also combined.

BRIEF DESCRIPTION OF THE DRAWING

The present invention will be further elucidated with reference to the non-limitative embodiment shown herein below. The FIGURE shows a view of a schematic three-dimensional representation of a mould according to the invention in partly exploded situation.

DETAILED DESCRIPTION OF THE PREFERRED EMBODIMENTS

The FIGURE shows a mould 1 consisting of an upper mould part 2 and a lower mould part 3. Lower mould part 3 is provided with a central beam 4 in which recesses 5 are arranged for placing pellets of encapsulating material. Also situated in central beam 4 in each recess 5 are plungers (not shown) with which pressure can be applied to the encapsulating material.

Support plates 6,7 are arranged on either side of central beam 4. Support plate 7 is shown in a detached position while support plate 6 is shown in an assembled position. Support plates 6,7 are provided with a large number of apertures 8 which are placed together in groups. These apertures 8 connect onto runners 9 which run through support plates 6,7 and which are only shown for a few of the apertures 8 by means of broken lines. These runners 9 connect onto tracks 10 arranged in a base block 11. Base blocks 11 are adapted to bear support plates 6,7. Each base block 11 is provided with an internal bore 12 which connects onto tracks 10. Base blocks 11 are each provided with an outlet 13 of the bores 12. By now connecting a fan (not shown) onto each outlet 13, air can be drawn in through bore 12, tracks 10, runners 9 and finally apertures 8. The suction of air through apertures 8 can be utilized to place carriers such as for instance lead frames or B.G.A's in flat position on the support plates 6,7. It is also possible to release carriers from support plates 6,7 by increasing the pressure close to the outlet 13. This increased pressure will be transmitted to the apertures 8, which at least simplified release of the carriers.

It is noted that the groups of apertures 8 are placed such that in terms of shape they correspond with the shape of the spaces 14 which are left clear in the contact side 15 of the upper mould part 2. These spaces 14 will be filled with encapsulating material, which implies that the carriers will contain electronic components precisely at that position where spaces 14 are situated. It is therefore important that the carrier is in flat position particularly at these positions. It is for this reason that the apertures 8 are arranged at precisely these positions.

Although the invention is elucidated with reference to only a single embodiment, it will be apparent to all that the invention is in no way limited to the described and shown embodiment. On the contrary, many more variations are possible for the skilled person within the scope of the invention. It is thus possible for instance to arrange aperture 8 also, or only, in the upper mould part 2, whereby release of a carrier provided with encapsulating material can be realized by applying an overpressure on apertures 8. In addition, there are numerous possible variations in respect of the number and positions of apertures 8.

The invention claimed is:

1. A mould for encapsulating electronic components mounted on a carrier, comprising:
   at least two mould parts displaceable relative to each other, at least one of which is provided with a recess for holding the electronic components and to be filled with encapsulating material, and
   feed means for filling the recess with encapsulating material,
   wherein at least a lower mould part of the mould parts is provided with a runner which connects on one side to a wall of the lower mould part co-defining a mould cavity and connects on the other side to a side of the lower mould part remote from the mould cavity,
   wherein the lower mould part comprises a flat support surface provided with plural runners arranged in patterns corresponding with locations where the recess in the at least one mould part is formed, the plural runners adapted to extract gasses therethrough to adhere the carrier in a flat position at multiple positions to the lower mould part.

2. The mould as claimed in claim 1, wherein a plurality of runners connecting onto the wall defining the mould cavity are in mutual communication and are connected to a single runner which connects onto a side of the lower mould part remote from the mould cavity.

3. The mould as claimed in claim 1, wherein the runner debouches in a wall defining a mould cavity, which wall is screened from a feed opening for encapsulating material by a carrier when encapsulating material is fed to the mould.

4. The mould as claimed in claim 1, wherein apertures are arranged in the wall of a lower mould part in patterns.

5. The mould as claimed in claim 1, wherein the lower mould part is provided with at least one aligning edge for positioning a carrier relative to the lower mould part.

6. An encapsulating device for encapsulating electronic components mounted on a carrier, comprising:
   a mould as claimed in claim 1,
   drive means for positioning and causing the mould parts to move relative to each other,
   feed means for encapsulating material, and
   a fan connecting onto the side of the runner remote from the mould cavity.

7. A method for encapsulating electronic components mounted on a carrier, using a mould with a lower mould part and an upper mould part defining a mould cavity, the method comprising the steps of:
- A) positioning at least one carrier relative to the lower mould part, the lower mould part comprising a flat support surface provided with plural runners arranged in patterns corresponding with locations where a recess in the lower mould part is formed, the plural runners adapted to extract gasses therethrough to adhere the carrier in a flat position at multiple positions to the lower mould part,
- B) closing the mould by moving the lower mould part and the upper mould part towards each other,
- C) feeding encapsulating material to the part of the mould cavity left clear by the carrier, and
- D) opening the upper and lower mould parts and removing the carrier with encapsulating material arranged thereon, wherein during step D) an overpressure is applied in the plural runners which overpressure releases the encapsulated electronic components from the lower mould part.

8. The method as claimed in claim 7, wherein after step A) and during step B) an underpressure is applied in the plural runners, whereby the carrier is sucked to the lower mould part.

* * * * *